US007361447B2

(12) United States Patent
Jung

(10) Patent No.: US 7,361,447 B2
(45) Date of Patent: Apr. 22, 2008

(54) PHOTORESIST POLYMER AND PHOTORESIST COMPOSITION CONTAINING THE SAME

(75) Inventor: Jae Chang Jung, Seoul (KR)

(73) Assignee: Hynix Semiconductor Inc., Gyunggi-Do (KR)

( * ) Notice: Subject to any disclaimer, the term of this patent is extended or adjusted under 35 U.S.C. 154(b) by 106 days.

(21) Appl. No.: 10/870,631

(22) Filed: Jun. 17, 2004

(65) Prior Publication Data

US 2005/0026080 A1 Feb. 3, 2005

(30) Foreign Application Priority Data

Jul. 30, 2003 (KR) ............ 10-2003-0052670
Sep. 29, 2003 (KR) ............ 10-2003-0067502

(51) Int. Cl.
*G03F 7/004* (2006.01)
*G03F 7/20* (2006.01)
*G03F 7/26* (2006.01)

(52) U.S. Cl. .................. 430/270.1; 430/273.1; 430/311

(58) Field of Classification Search ......... 430/270.1, 430/273.1, 311
See application file for complete search history.

(56) References Cited

U.S. PATENT DOCUMENTS 4,603,101 A * 7/1986 Crivello ............... 430/270.1

(Continued)

FOREIGN PATENT DOCUMENTS

CN 1157475 8/1997

(Continued)

OTHER PUBLICATIONS

Taiwan Search Report; Taiwan Patent Application No. 093118337; search completed Jan. 10, 2007 (English and Chinese).

*Primary Examiner*—Amanda Walke
(74) *Attorney, Agent, or Firm*—Marshall, Gerstein & Borun LLP

(57) ABSTRACT

Photoresist polymers and photoresist compositions containing the same. Photoresist patterns of less than 50 nm are achieved with EUV (Extreme Ultraviolet) as an exposure light source with photoresist compositions comprising (i) a photoresist polymer comprising a polymerization repeating unit of Formula 2 or (ii) a photoresist polymer comprising a polymerization repeating unit of Formula 3 with polyvinylphenol. As a result, excellent etching resistance can be secured although the photoresist patterns have a very small thickness.

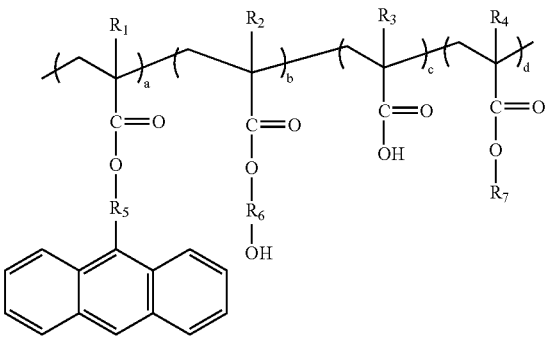

Formula 2

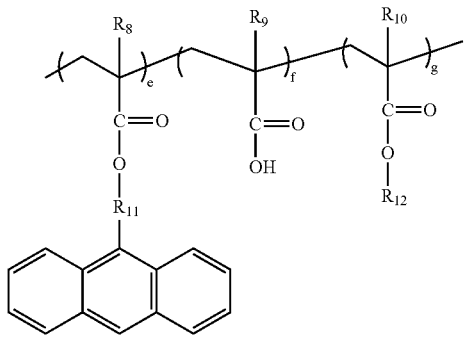

Formula 3 wherein $R_1$, $R_2$, $R_3$, $R_4$, $R_5$, $R_6$, $R_7$, $R_8$, $R_9$, $R_{10}$, $R_{11}$, $R_{12}$, a, b, c, d, e, f and g are as defined in the specification.

22 Claims, 3 Drawing Sheets

U.S. PATENT DOCUMENTS

| | | | |
|---|---|---|---|
| 5,939,236 A * | 8/1999 | Pavelchek et al. | 430/273.1 |
| 6,165,684 A * | 12/2000 | Mizutani et al. | 430/271.1 |
| 6,190,839 B1 * | 2/2001 | Pavelchek et al. | 430/325 |
| 6,399,269 B2 * | 6/2002 | Mizutani et al. | 430/270.1 |
| 6,486,283 B2 * | 11/2002 | Hong et al. | 526/328.5 |
| 6,503,689 B2 * | 1/2003 | Zampini et al. | 430/270.1 |
| 6,576,681 B2 * | 6/2003 | Zampini et al. | 521/77 |
| 6,610,808 B2 * | 8/2003 | De et al. | 526/281 |
| 6,653,049 B2 * | 11/2003 | Pavelchek et al. | 430/272.1 |
| 6,686,124 B1 * | 2/2004 | Angelopoulos et al. | 430/271.1 |
| 6,808,869 B1 * | 10/2004 | Mizutani et al. | 430/325 |
| 6,849,373 B2 * | 2/2005 | Pavelchek et al. | 430/270.1 |
| 6,852,421 B2 * | 2/2005 | Wayton et al. | 428/480 |
| 6,855,466 B2 * | 2/2005 | Pavelchek et al. | 430/14 |
| 6,887,648 B2 * | 5/2005 | Pavelchek et al. | 430/271.1 |
| 6,890,448 B2 * | 5/2005 | Pavelchek | 216/16 |
| 6,897,004 B2 * | 5/2005 | Uenishi et al. | 430/270.1 |
| 6,924,339 B2 * | 8/2005 | De et al. | 525/328.8 |

FOREIGN PATENT DOCUMENTS

| | | |
|---|---|---|
| KR | 10-2000-0060410 A | 10/2000 |
| KR | 10-2000-0067184 A | 11/2000 |
| KR | 10-2001-0057924 A | 7/2001 |
| KR | 10-2002-0059261 A | 7/2002 |
| KR | 10-2005-0014178 A | 2/2005 |
| TW | 538316 | 6/2003 |
| TW | 200300871 | 6/2003 |

* cited by examiner

PHOTORESIST POLYMER AND PHOTORESIST COMPOSITION CONTAINING THE SAME

BACKGROUND

1. Technical Field

Photoresist polymers and photoresist compositions containing the same are disclosed that are suitable for a photolighography process using a light source of the far ultraviolet region such as EUV (Extreme Ultraviolet, 13 nm) in production of ultrafine circuits of highly-integrated semiconductor devices.

2. Description of the Related Art

Recently, chemical amplification type deep ultraviolet (DUV) photoresists have been investigated in order to achieve higher sensitivities in ultrafine circuit formation processes. Such photoresists are prepared by blending a photoacid generator and a matrix polymer having an acid labile group.

According to reaction mechanism of such a photoresist, the photoacid generator generates acid when it is irradiated by UV light source, and the main chain or a branched chain of the matrix polymer reacts with the generated acid during a subsequent baking process and is decomposed or crosslinked, so that polarity of the polymer is considerably altered. This alteration in the polarity creates a solubility difference in the developing solution between an exposed area and an unexposed area.

For example, in case of a positive photoresist, acid is generated in the exposed area, and the generated acid reacts with the matrix polymer during the subsequent baking process so that the main chain or branched chain of the polymer is decomposed and dissolved in a subsequent developing process. However, since acid is not generated in the unexposed area, original structure of the polymer is maintained and is not dissolved during the subsequent developing process, thereby forming a positive image of a mask on a substrate.

In any lithography process, resolution is dependent upon the wavelength of the light source. As the wavelength of light source becomes smaller, ultrafine patterns of a greater degree may be formed. As far as exposure equipment required to form patterns of less than 50 nm, EUV equipment is under development, and improved photoresists for patterns of less than 50 nm are also under development. In case of the photoresist, it is expected that significant problems will occur for the successful formation of patterns of less than 50 nm. For example, on one hand, the photoresist will need to be deposited in a very thin film but, on the other hand, thin films cannot ensure sufficient etching resistance. Therefore, there is a need improved photoresists having excellent etching resistance that can be deposited in very thin films for forming patterns of less than 50 nm.

SUMMARY OF THE DISCLOSURE

Accordingly, photoresist polymers and photoresist compositions containing the same are disclosed which are applicable in a photolithography process, especially one using EUV, to form ultrafine patterns of less than 50 nm.

A process for forming photoresist patterns by using the above described photoresist compositions, and semiconductor devices produced by using the above-described photoresist compositions are also disclosed.

DETAILED DESCRIPTION OF THE PREFERRED EMBODIMENTS

Figure 1:
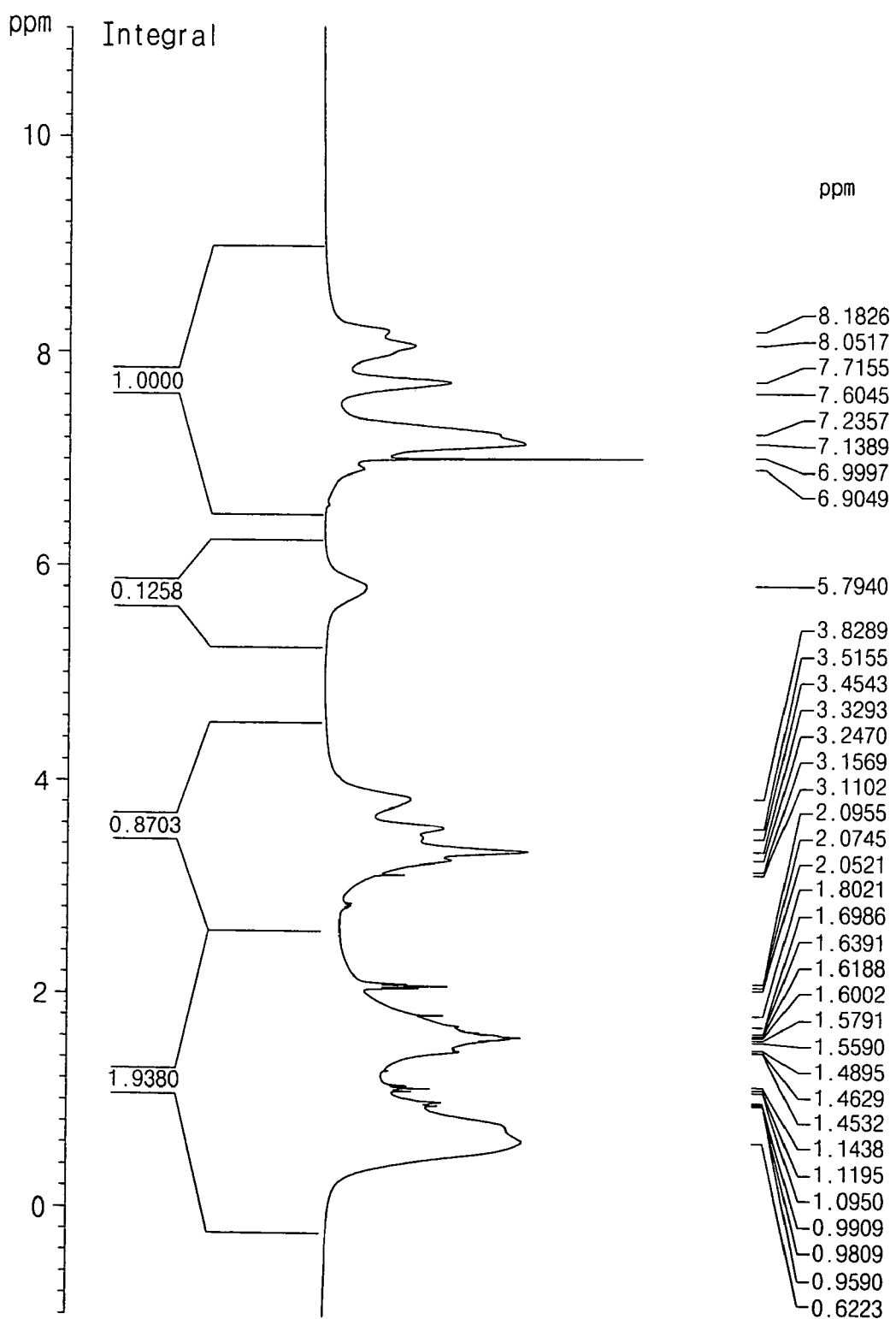
FIG. 1 is a NMR spectrum of a photoresist polymer obtained from Example 1.

A photoresist polymer is disclosed which comprises a polymerization repeating unit represented by Formula 1:

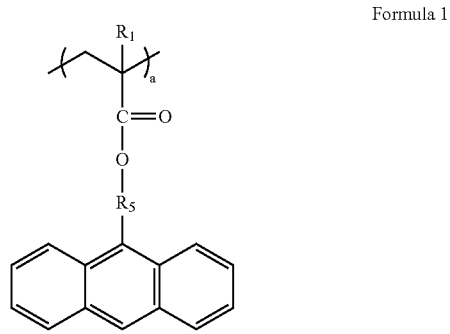

Formula 1 wherein $R_1$ is hydrogen or methyl group; and $R_5$ is linear or branched $C_1$-$C_{10}$ alkylene group.

The polymerization repeating unit of Formula 1 includes an anthracene type monomer having excellent etching resistance.

Preferably, the photoresist polymer comprises a polymerization repeating unit represented by Formula 2 or 3:

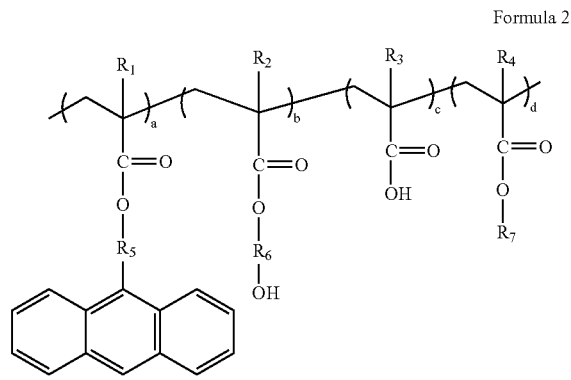

Formula 2 wherein $R_1$, $R_2$, $R_3$ and $R_4$ are individually hydrogen or methyl group;

$R_5$ and $R_6$ are individually linear or branched $C_1$-$C_{10}$ alkylene group;

$R_7$ is an acid labile protecting group; and a:b:c:d=20~60 mol %:5~20 mol %:3~15 mol %:20~50 mol %.

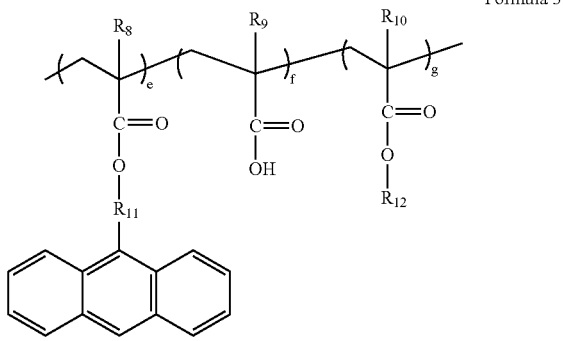

Formula 3 wherein $R_8$, $R_9$ and $R_{10}$ are individually hydrogen or methyl group;

$R_{11}$ is linear or branched $C_1$-$C_{10}$ alkylene group;

$R_{12}$ is an acid labile protecting group; and e:f:g=30~60 mol %:5~25 mol %:30~50 mol %.

The polymerization repeating unit of Formula 2 is preferably exemplified by poly(9-anthracene methyl methacrylate/2-hydroxyethyl methacrylate/t-butylacrylate/acrylic acid), an example of the polymerization repeating unit of Formula 3 is preferably poly(9-anthracenemethyl methacrylate/t-butylacrylate/acrylic acid).

The acid labile protecting group which means a group to be separated by an acid prevents the photoresist from dissolving in an alkaline developing solution if the acid labile protecting group is bonded thereto. If the acid labile protecting group is separated by acid exposure, the photoresist may then be dissolved in an alkaline solution.

The acid labile protecting group can be any of known protective groups, and some of conventional acid labile protecting groups are disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). The acid labile protecting group includes, but be not limited to, any one selected from the group consisting of t-butyl, tetrahydropyran-2-yl, 2-methyl tetrahydropyran-2-yl, tetrahydrofuran-2-yl, 2-methyl tetrahydrofuran-2-yl, 1-methoxyprophyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl and 2-acetylmenth-1-yl.

A positive photoresist composition is also disclosed which comprises the photoresist polymer of mentioned above as a base resin, a photoacid generator and an organic solvent.

The base resin comprises (i) the photoresist polymer comprising the polymerization repeating unit of Formula 2 or (ii) the photoresist polymer comprising the polymerization repeating unit of Formula 3 with polyvinylphenol.

When the base resin comprises the photoresist polymer comprising the polymerization repeating unit of Formula 3 with polyvinylphenol, the polyvinylphenol is preferably present in an amount ranging from 5 to 20 wt % based on the photoresist polymer comprising the polymerization repeating unit of Formula 3.

The photoacid generator may be selected from any of conventional compounds which can generate acid by light including, for example, the compounds disclosed in the above known documents. Among them, preferably used are sulfide type or onium type compounds for the photoacid generator.

Preferably, the photoacid generator is one or more compounds selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone, naphthylimido trifluoromethane sulfonate and a compound of Formula 4 below. Herein, the photoacid generator is present in an amount ranging from 1 to 8 wt % based on the photoresist polymer. It has been found that photosensitivity of the photoresist is lowered when the photoacid generator is used in the amount of less than 1 wt %. However, when used in the amount of more than 8 wt %, the photoacid generator absorbs far ultraviolet lays and generates a large amount of acids, thereby obtaining poor patterns and generating particles due to solubility after the developing process.

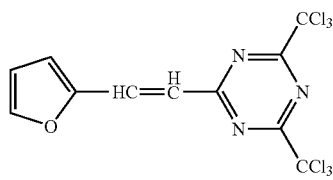

Formula 4

Any of conventional organic solvents can be used in the photoresist composition including, for example, the conventional solvents disclosed in the documents described above. The organic solvent preferably includes any one selected from the group consisting of methyl 3-methoxypropionate, ethyl 3-ethoxypropionate, propylene glycol methyl ether acetate, cyclohexanone, 2-heptanone, ethyl lactate and mixtures thereof. The organic solvent is present in an amount ranging from 500 to 8000 wt % based on the photoresist polymer to obtain a photoresist film having a desired thickness.

A disclosed method for forming a photoresist pattern (hereinafter referred to as "the patterning method") comprises:

(a) coating the photoresist composition on top portion of an underlying layer to form a photoresist film;

(b) exposing the photoresist film to light; and (c) developing the exposed photoresist film to obtain a photoresist pattern.

The patterning method can further comprise a soft baking process performed before the step (b) or a post baking process performed after the step (b). The baking process is preferably performed at a temperature ranging from 70 to 200° C.

The exposure process is preferably performed by using a light source selected from the group consisting of EUV (13 nm), VUV (157 nm), E-beam, X-beam and ion beam with exposure energy ranging from 1 to 100 mJ/cm2.

The developing process (c) can be performed with alkaline developing solution which is preferably TMAH aqueous solution ranging from 0.01 to 5 wt %.

According to mechanism of the disclosed positive photoresists, the photoacid generator generates acid when it is exposed to ultraviolet rays from a light source. In the baking process after exposure, the acid reacts with the polymer comprising the repeating unit of Formula 2, and separates the acid labile protecting group. As a result, the branched chain of the polymer is decomposed and dissolved in the alkaline developing solution in the subsequent developing process. Alternatively, the acid reacts with the polymer comprising the repeating unit of Formula 3 and separates the acid labile protecting group during the baking process after exposure. As a result, the branched chain of the polymer is decomposed and dissolved in the alkaline developing solution in the subsequent developing process. In this case, the polyvinylphenol itself is dissolved in the alkaline developing solution, thus, creating no problem in the developing process.

On the other hand, since acid is not generated in the unexposed area, the polymer comprising the repeating units of Formula 2 or 3 is not dissolved, thereby obtaining an image of a mask as a positive image.

In case of using the polymer comprising the repeating unit of Formula 3 and the polyvinylphenol are together used as the base resin, an esterification occurs between carboxylic acid in the polymer comprising the repeating unit of Formula 3 and the polyvinylphenol to generate cross-linkage bond if a resist flowing process is performed after formation of the photoresist pattern. By such linkage bond, the photoresist pattern maintains its form after it is flowed. In this way, flow characteristic of the photoresist pattern can be improved by adding the polyvinylphenol as the base resin. If the polyvinylphenol is not used, an expected problem is that deformation of the photoresist pattern may occur during the resist flowing process.

In addition, a semiconductor device manufactured using the photoresist composition described above is also disclosed.

Hereinafter, the disclosed photoresist polymers and the photoresist compositions containing the same will be described in more details by referring to examples below, which are not intended to be limiting.

EXAMPLE 1

Preparation of Photoresist Polymer (1)

To 50 g of propylene glycol methyl ether acetate (PGMEA) were added 5 g of 9-anthracenemethyl methacrylate, 1 g of 2-hydroxyethyl methacrylate, 3 g of t-butylacrylate, 1 g of acrylic acid and 0.4 g of AIBN. The prepared solution was reacted at 66° C. for 8 hours. After the reaction, the resulting mixture was precipitated in ethyl ether, filtered, and dried under vacuum condition, thereby obtaining poly(9-anthracenemethyl methacrylate/2-hydroxyethyl methacrylate/t-butylacrylate/acrylic acid) having a molecular weight of 12,500 (yield: 88%) (see the NMR spectrum of FIG. 1).

EXAMPLE 2

Preparation of Photoresist Polymer (2)

Figure 2:
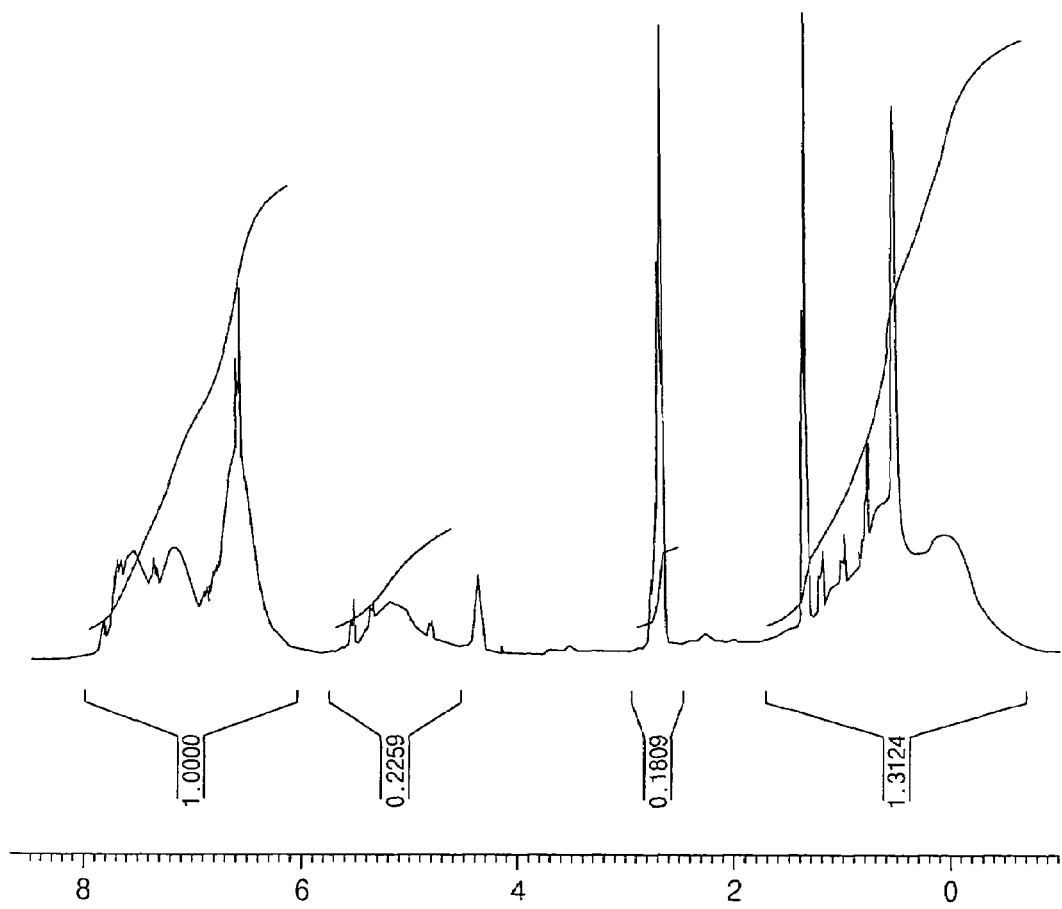
FIG. 2 is a NMR spectrum of a photoresist polymer obtained from Example 2.

To 50 g of PGMEA were added 6 g of 9-anthracenemethyl methacrylate, 3 g of t-butylacrylate, 1 g of acrylic acid and 0.8 g of AIBN. The prepared solution was reacted at 66° C. for 8 hours. After the reaction, the resulting mixture was precipitated in ethyl ether, filtered, and dried under vacuum condition thereby obtaining poly(9-anthracenemethyl methacrylate/t-butylacrylate/acrylic acid) having a molecular weight of 11,200 (yield: 80%) (see the NMR spectrum of FIG. 2).

EXAMPLE 3

Preparation of Photoresist Composition (1)

To 13 g of PGMEA as an organic solvent were added 1 g of the poly(9-anthracenemethyl methacrylate/2-hydroxyethyl methacrylate/t-butylacrylate/acrylic acid) obtained from Example 1 and 0.04 g of triphenylsulfonium triflate as a photoacid generator. The resulting mixture was filtered in a 0.20 µm filter, thereby obtaining a photoresist composition.

EXAMPLE 4

Preparation of Photoresist Composition (2)

To 200 g of cyclohexanone as an organic solvent were added 9 g of the poly(9-anthracenemethyl methacrylate/t-butylacrylate/acrylic acid) obtained from Example 2, 1 g of polyvinylphenol having a molecular weight of 4,000 and 0.5 g of the compound of Formula 4 as a photoacid generator for I-line. The resulting mixture was filtered in a 0.20 µm filter, thereby obtaining a photoresist composition.

EXAMPLE 5

Formation of Photoresist Film

The photoresist composition obtained from Example 3 was spin-coated on a silicon wafer at a thickness of 3000 Å to form a photoresist film, and baked at 130° C. for 90 seconds. After baking, the photoresist film was etched by using a mixture gas of CF4 and Ar. It was observed that etching speed of the photoresist film was about 80% as compared with a KrF photoresist film formed with the same thickness then etched, thereby showing the improved etching resistance.

EXAMPLE 6

Formation of Contact hole Pattern

Figure 3:
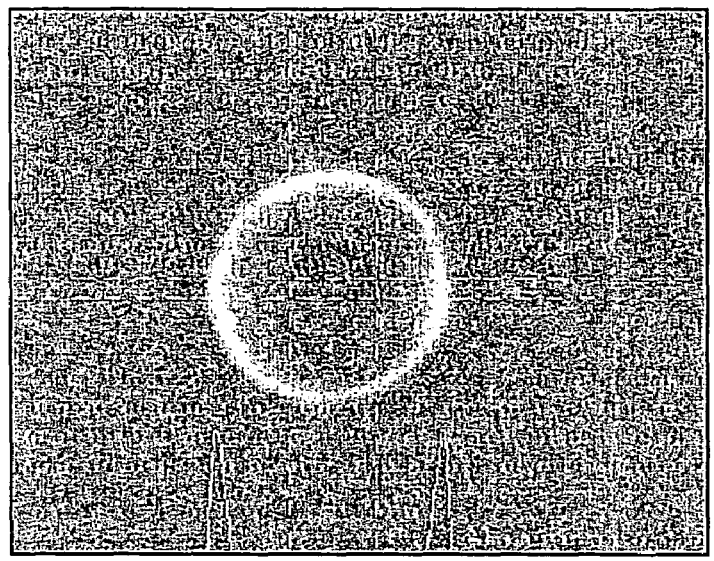
FIG. 3 is a photograph of a contact hole pattern obtained from Example 6.

The photoresist composition obtained from Example 4 was spin-coated on a silicon wafer to form a photoresist film, and baked at 120° C. for 90 seconds. After baking, the photoresist film was exposed to light by using an I-line exposure device. After the baking process was completed, the baked film was developed in 2.38 wt % TMAH aqueous solution for 40 seconds, thereby obtaining a contact hole pattern of 300 nm (see FIG. 3).

EXAMPLE 7

Evaluation of Resist Flow Characteristic

Figure 4:
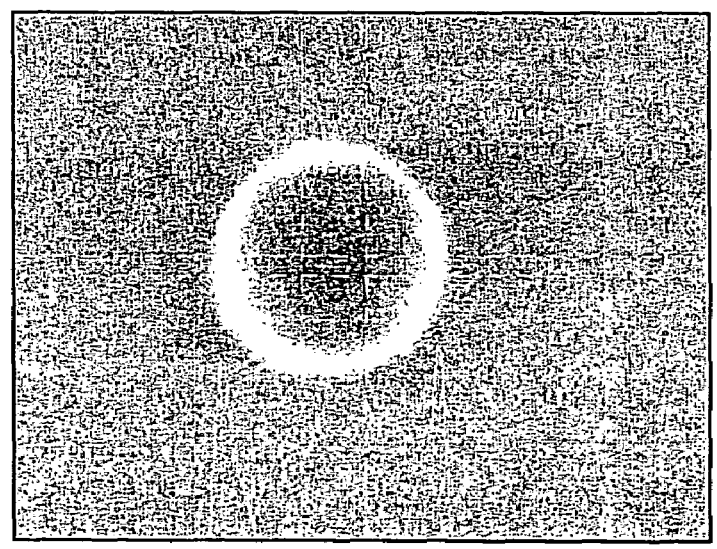
FIG. 4 is a photograph of a contact hole pattern by a resist flow process obtained from Example 7.

The contact hole pattern of 300 nm obtained from Example 6 was baked at 160° C. for 90 seconds to evaluate resist flow characteristic thereof. As a result, it was observed that the contact hole pattern was reduced to 218 nm in size by resist flow and no deformation of pattern was occurred (see FIG. 4).

As discussed earlier, since photoresist patterns are formed by using positive photoresist compositions comprising anthracene type compounds having excellent etching resistance, photoresist patterns of less than 50 nm with excellent etching resistance can be formed by using EUV as an exposure light source although the photoresist patterns have a small thickness.

What is claimed is:

1. A photoresist composition comprising:
a photoresist polymer as a base resin;
a photoacid generator; and
an organic solvent;
wherein the base resin comprises a photoresist polymer comprising a polymerization repeating unit of Formula 2:

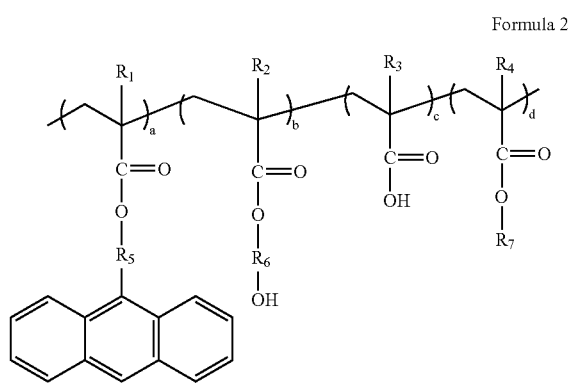

Formula 2 wherein $R_1$, $R_2$, $R_3$ and $R_4$ are individually hydrogen or methyl group;
$R_5$ and $R_6$ are individually a linear or branched $C_1$-$C_{10}$ alkylene group;
$R_7$ is an acid labile protecting group; and
a:b:c:d=20~60 mol %:5~20 mol %:3~15 mol %:20~50 mol %.

2. The photoresist composition according to claim 1, wherein the polymerization repeating unit of Formula 2 is poly(9-anthracenemethyl methacrylate/2-hydroxyethyl methacrylate/t-butylacrylate/acrylic acid).

3. The photoresist composition according to claim 1, wherein the acid labile protecting group is selected from the group consisting of t-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl and 2-acetylmenth-1-yl.

4. The photoresist composition according to claim 1, wherein the photoacid generator is one or more compounds selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone, naphthylimido trifluoromethane sulfonate and a compound of Formula 4:

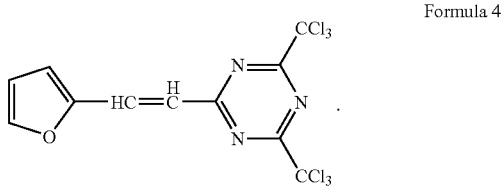

Formula 4

5. The photoresist composition according to claim 1, wherein the photoacid generator is present in an amount ranging from 1 to 8 wt % based on the photoresist polymer.

6. The photoresist composition according to claim 1, wherein the organic solvent is selected from the group consisting of methyl 3-methoxypropionate, ethyl 3-ethoxypropionate, propylene glycol methyl ether acetate, cyclohexanone, 2-heptanone, ethyl lactate and mixtures thereof.

7. The photoresist composition according to claim 1, wherein the organic solvent is present in an amount ranging from 500 to 8000 wt % based on the photoresist polymer.

8. A photoresist composition comprising:
a photoresist polymer as a base resin;
a photoacid generator; and
an organic solvent;
wherein the base resin comprises polyvinylphenol and a photoresist polymer comprising a polymerization repeating unit of Formula 3:

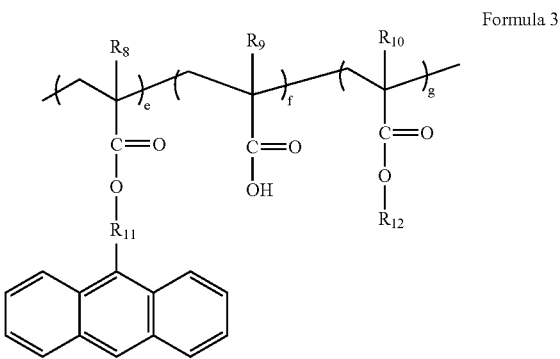

Formula 3 wherein $R_8$, $R_9$ and $R_{10}$ are individually hydrogen or a methyl group;
$R_{11}$ is a linear or branched $C_1$-$C_{10}$ alkylene group;
$R_{12}$ is an acid labile protecting group; and
e:f:g=30~60 mol %:5~25 mol %:30~50 mol %.

9. The photoresist composition according to claim 8, wherein the polyvinylphenol is present in an amount ranging from 5 to 20 wt % based on the photoresist polymer comprising the polymerization repeating unit of Formula 3.

10. The photoresist composition according to claim 8, wherein the composition is used in a resist flow process.

11. The photoresist composition according to claim 8, wherein the polymerization repeating unit of Formula 3 is poly(9-anthracenemethyl methacrylate/t-butylacrylate/acrylic acid).

12. The photoresist composition according to claim 8, wherein the acid labile protecting group is selected from the group consisting of t-butyl, tetrahydropyran-2-yl, 2-methyl tetrahydropyran-2-yl, tetrahydrofuran-2-yl, 2-methyl tetrahydrofuran-2-yl, 1-methoxypropyl, 1-methoxy-1-methylethyl, 1-ethoxypropyl, 1-ethoxy-1-methylethyl, 1-methoxyethyl, 1-ethoxyethyl, t-butoxyethyl, 1-isobutoxyethyl and 2-acetylmenth-1-yl.

13. The photoresist composition according to claim 8, wherein the photoacid generator is one or more compounds selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, diphenyl p-t-butylphenylsulfonium triflate, triphenylsulfonium hexafluorophosphate, triphenylsulfonium hexafluoroarsenate, triphenylsulfonium hexafluoroantimonate, triphenylsulfonium triflate, dibutylnaphthylsulfonium triflate, phthalimidotrifluoromethane sulfonate, dinitrobenzyltosylate, n-decyl disulfone, naphthylimido trifluoromethane sulfonate and a compound of Formula 4:

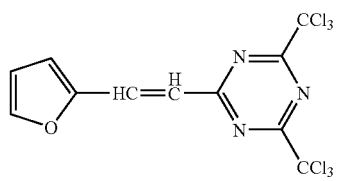

Formula 4

14. The photoresist composition according to claim 8, wherein the photoacid generator is present in an amount ranging from 1 to 8 wt % based on the photoresist polymer.

15. The photoresist composition according to claim 8, wherein the organic solvent is selected from the group consisting of methyl 3-methoxypropionate, ethyl 3-ethoxypropionate, propylene glycol methyl ether acetate, cyclohexanone, 2-heptanone, ethyl lactate and mixtures thereof.

16. The photoresist composition according to claim 8, wherein the organic solvent is present in an amount ranging from 500 to 8000 wt % based on the photoresist polymer.

17. A method for forming a photoresist pattern, comprising:
   (a) coating the photoresist composition of claim 1 on a top portion of an underlying layer to form a photoresist film;
   (b) exposing the photoresist film to EUV light; and
   (c) developing the exposed photoresist film to obtain a photoresist pattern.

18. A semiconductor device manufactured according to the method of claim 17.

19. A method for forming a photoresist pattern, comprising:
   (a) coating the photoresist composition of claim 8 on a top portion of an underlying layer to form a photoresist film;
   (b) exposing the photoresist film to EUV light; and
   (c) developing the exposed photoresist film to obtain a first photoresist pattern.

20. The method according to claim 19, further comprising performing a resist flow process after part (c) to obtain a second photoresist pattern.

21. A semiconductor device manufactured according to the method of claim 19.

22. The method according to any one of claim 17 or 19, further comprising performing a soft baking process before part (b) or a post baking process after part (b).

* * * * *